United States Patent
Kim

[19]

[11] Patent Number: 6,058,407
[45] Date of Patent: May 2, 2000

[54] FIR (FINITE IMPULSE RESPONSE) FILTER WITH NON-SYMMETRIC FREQUENCY RESPONSE CHARACTERISTICS

[75] Inventor: Dae-Hyun Kim, Seoul, Rep. of Korea

[73] Assignee: Hyundai Electronics Ind. Co., Ltd., Kyoungki-do, Rep. of Korea

[21] Appl. No.: 09/031,453

[22] Filed: Feb. 26, 1998

[30]     Foreign Application Priority Data

Jun. 28, 1997 [KR] Rep. of Korea ................ 97-28625

[51] Int. Cl.⁷ ............................................. G06F 17/10
[52] U.S. Cl. .................................... 708/319; 708/301
[58] Field of Search ........................ 708/301, 319, 708/320

[56]           References Cited

U.S. PATENT DOCUMENTS

| | | | |
|---|---|---|---|
| 4,811,259 | 3/1989 | Costas | 708/319 |
| 4,933,891 | 6/1990 | Scheak | 708/319 |
| 5,050,119 | 9/1991 | Lish | 708/319 |
| 5,210,705 | 5/1993 | Chauvel et al. | 708/319 |
| 5,212,659 | 5/1993 | Scott et al. | 364/724.1 |
| 5,212,660 | 5/1993 | Orihara | 708/319 |
| 5,245,561 | 9/1993 | Sugiyama | 708/319 |
| 5,392,230 | 2/1995 | Christopher | 708/319 |
| 5,500,811 | 3/1996 | Corry | 708/319 |
| 5,548,541 | 8/1996 | Bierman et al. | 708/319 |
| 5,636,151 | 6/1997 | Ikeda | 708/319 |

*Primary Examiner*—David H. Malzahn
*Attorney, Agent, or Firm*—McAulay Nissen Goldberg Kiel & Hand, LLP

[57]           ABSTRACT

The FIR (Finite Impulse Response) filter with non-symmetric frequency response characteristics; data stored in the shift register is selected by the select signal to be outputted from the multiplier. The tab coefficient stored in the tab coefficient generator is outputted through the multiplier according to 2 bit select signal to be multiplied. The multiplied to be output signal is stored in D flip-flop at the rising edge of a second clock 2. The data stored in a D flip-flop is selected by the select signal to be added in the adder. The adding result is that just one fourth of the tab number is added. Therefore, this one fourth of the adding result is to be stored in D flip-flop first in order to add the rest of three fourths in the same process. 90°-transited quota Qout) can be produced storing all tabs added in this way of four steps in respective D flip-flops and adding all tabs in the adder finally.

18 Claims, 7 Drawing Sheets

| tap index | VSB filter Coefficient | Hilbert filter Coefficient | tap index | VSB filter Coefficient | Hilbert filter Coefficient |
|---|---|---|---|---|---|
| 1 | $H_1=-0.0195$ | −0.0424 | 31 | $H_{31}=0.0195$ | 0.0424 |
| 2 | 0 | 0 | 30 | 0 | 0 |
| 3 | $H_3=-0.0278$ | −0.049 | 29 | $H_{29}=0.0278$ | 0.049 |
| 4 | 0 | 0 | 28 | 0 | 0 |
| 5 | $H_5=-0.039$ | −0.0579 | 27 | $H_{27}=0.039$ | 0.0579 |
| 6 | 0 | 0 | 26 | 0 | 0 |
| 7 | $H_7=-0.0546$ | −0.0707 | 25 | $H_{25}=0.0546$ | 0.0707 |
| 8 | 0 | 0 | 24 | 0 | 0 |
| 9 | $H_9=-0.0779$ | −0.0909 | 23 | $H_{23}=0.0779$ | 0.0909 |
| 10 | 0 | 0 | 22 | 0 | 0 |
| 11 | $H_{11}=-0.1178$ | −0.1273 | 21 | $H_{21}=0.1178$ | 0.1273 |
| 12 | 0 | 0 | 20 | 0 | 0 |
| 13 | $H_{13}=-0.2064$ | −0.2122 | 19 | $H_{19}=0.2064$ | 0.2122 |
| 14 | 0 | 0 | 18 | 0 | 0 |
| 15 | $H_{15}=-0.6347$ | −0.6366 | 17 | $H_{17}=0.6347$ | 0.6366 |
| 16 | 0 | 0 | | 0 | 0 |

FIR (FINITE IMPULSE RESPONSE) FILTER WITH NON-SYMMETRIC FREQUENCY RESPONSE CHARACTERISTICS

FIELD OF THE INVENTION

The present invention relates to the FIR (Finite Impulse Response) filter with non-symmetric frequency response characteristics, and more particularly the present invention relates to simplifying the circuit as it compose the filter using the multipliers that is equivalent to the one fourth of filter tab numbers.

BACKGROUND OF THE INVENTION

The basic structure of all filters is determined by the coefficient value extracted from each algorithm and by this tab number. Therefore, the FIR (Finite Impulse Response) filter with non-symmetric structure can be embodied when the above coefficient value and tab number are determined.

The below expression shows the relation between filter tab numbers and tab coefficients.

$$K=(M+1)/2, \text{ M is an odd number}$$
$$K=M/2, \text{ M is an even number} \quad (1)$$

In the above, M means the tab number and K means the tab coefficient number.

For example, in the case of FIR (Finite Impulse Response) filter with 31 tabs of non-symmetric frequency response, the tab coefficient number is to be $(31+1)/2=16$. Input this into the filter to produce the desired value.

However, the prior FIR (Finite Impulse Response) filter like the above executes the arithmetic operation as much of tab number. It needs the same number of multipliers as that of the tabs; the size of the filter is supposed to get larger in proportion to the above tab numbers, which is the problem.

In other words, the main factor determining the chip size of IC (Integrated Circuit) is multiplier; there is a problem that the chip size is not to be diminished as this multiplier numbers increase in proportion to the tab numbers.

SUMMARY OF THE INVENTION

The present invention solves the above problem. The object of the present invention is to provide the FIR (Finite Impulse Response) filter with non-symmetric frequency response characteristics simplifying the circuit of the filter, diminishing the chip size, reducing the cost of production and reducing the manufacturing process.

The other object of the present invention is to provide the FIR (Finite Impulse Response) filter with non-symmetric frequency response characteristics reducing the multiplier numbers according to multiplication by time-divisional selecting the applied data to the multipliers.

The FIR (Finite Impulse Response) filter of the present invention reduces the multiplier numbers and achieves the above object. The data stored in shift register is output to the multiplier being selected by multiplexer according to the select signal value. At this time, the tab coefficient stored in tab coefficient generation section is output to the multiplier according to the two-bit select signal value to be multiplied. The multiplied output signal is stored in D flip-flop at the rising edge of the clock 2 clk2; then stored in another D flip-flop at the falling edge of the clock 2 clk2. The data stored in D flip-flop is selected by select signal to be added in the adder. The result of this add is considered only of the one-fourth tab numbers. Therefore, in order to add the rest three-fourths tab numbers through the same process, we should store the result of adding the one fourth in D flip-flop. Adding all tabs in four steps in this way and storing them in each D flip-flop, 90°-shifted value Qout would be produced finally after adding all tabs through the adder.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments of the present invention, example of which are illustrated in the accompanying drawings.

Figure 1:
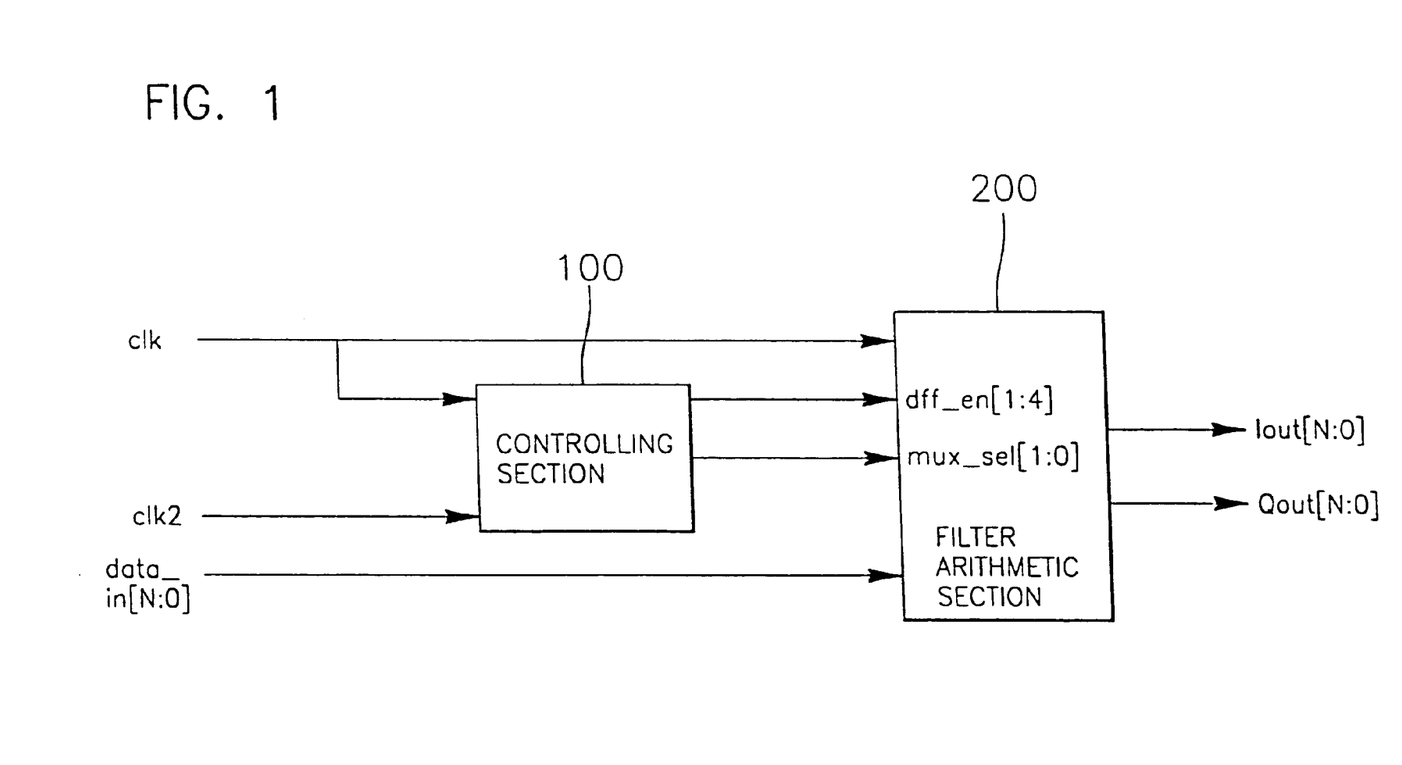
FIG. 1 is the block diagram of the FIR (Finite Impulse Response) filter with non-symmetric frequency response characteristics according to the present invention.

FIG. 1 shows the block diagram of the FIR (Finite Impulse Response) filter. Controlling section 100 generates control signal; filter arithmetic section 200 executes filter function using the multiplier during 1.5 data clock according to the control of the controlling section 100.

Figure 2:
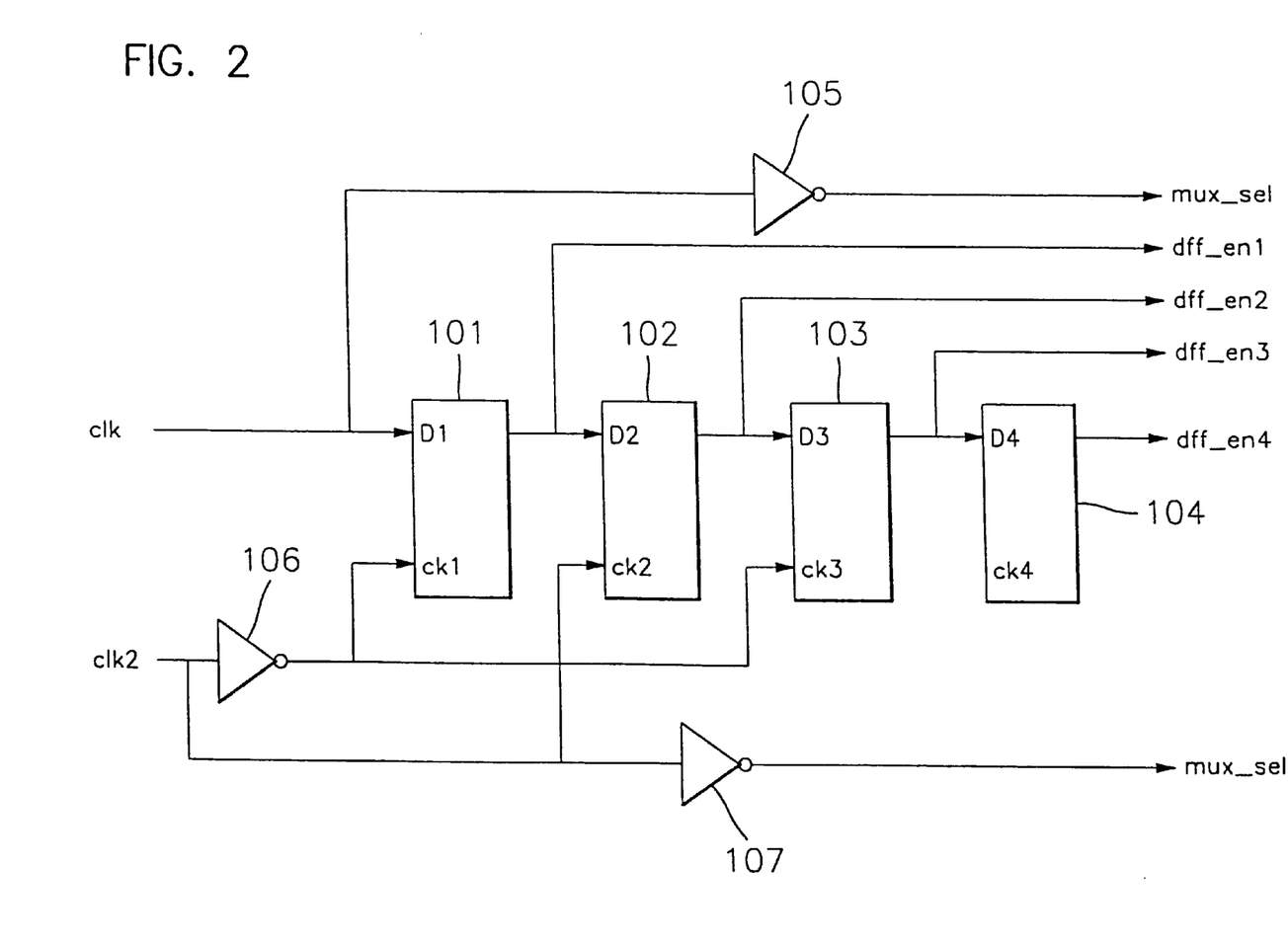
FIG. 2 is the block diagram of control signal converting section in the FIR (Finite Impulse Response) filter with non-symmetric frequency response characteristics according to the present invention.

FIG. 2 shows the block diagram of control signal converting section.

As shown in the figure, four-D flip-flops 101–104 are connected in series, the clock 1 clk1 is input in the input terminal D1–D4 of four-D flip-flops 101–104. The clock 2 clk2 is input to be converted 180° through the inverter 2 106 in the clock terminal ck1, ck3 of D flip-flop 1 101 and D flip-flop 3 103; the clock 2 clk2 has twice higher speed than the clock 1 clk1. The clock 2 clk2 is input in the clock terminal ck2 of D flip-flop 2 102. The clock 1 clk1 is converted through the inverter 1 105 and used as the input control signal 1 mux_sel0; the clock 2 clk2 is used as the input control signal 2 mux_sel1 through the inverter 3 107.

The output of the D flip-flop 1 101 is used as the time division control signal 1 dff_en1; the output of the D flip-flop 2 102, as the time division control signal 2 dff_en2; the output of the D flip-flop 3 103, as the time division control signal 3 dff_en3; the output of the D flip-flop 4 104, as the time division control signal 4 dff_en4.

Figure 3:
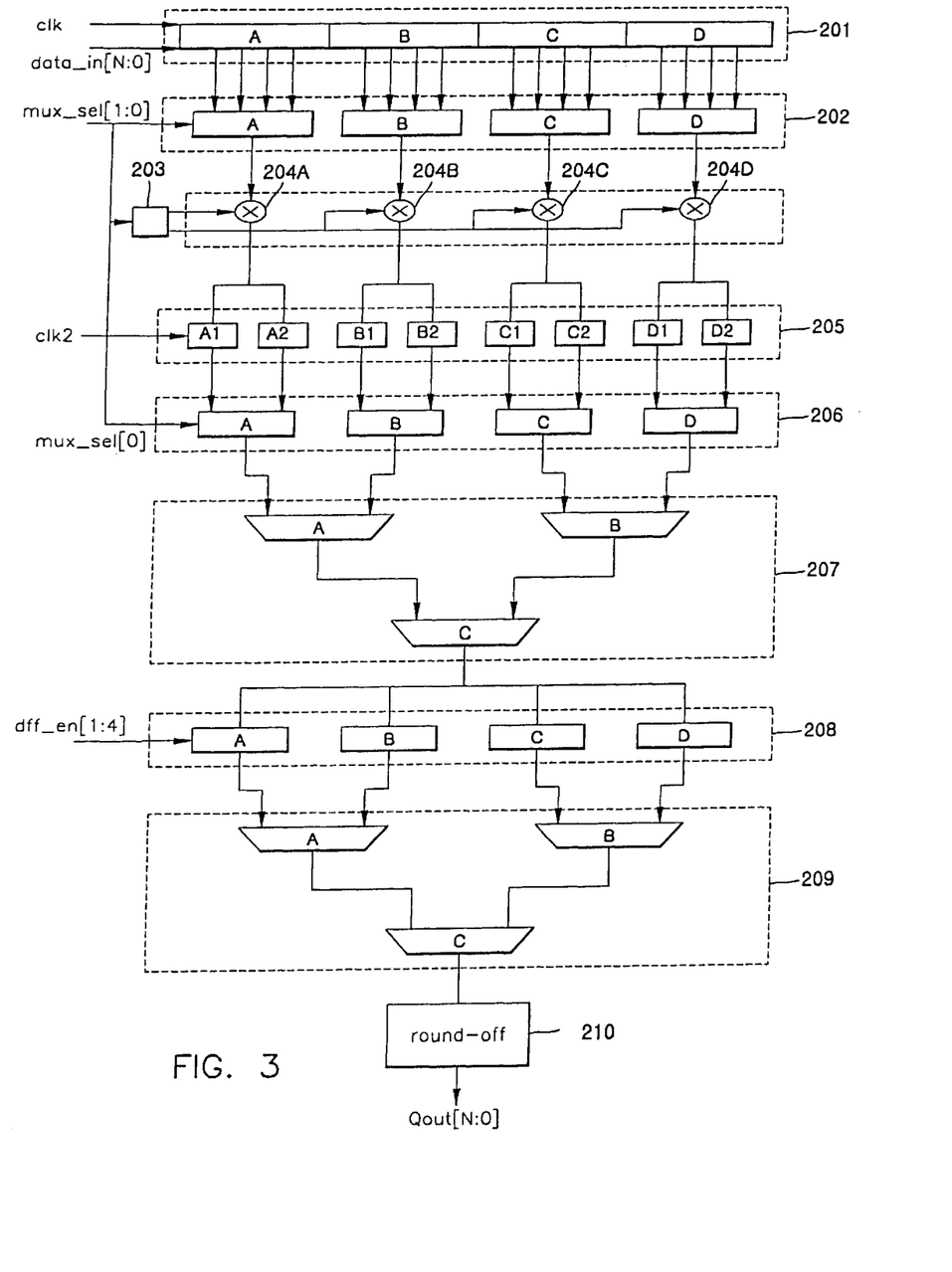
FIG. 3 is the block diagram of filter arithmetic section in the FIR (Finite Impulse Response) filter with non-symmetric frequency response characteristics according to the present invention.

FIG. 3 shows the block diagram of the filter arithmetic section of the FIR (Finite Impulse Response) filter.

The filter arithmetic section of the FIR (Finite Impulse Response) filter comprises the shift registers 1 to 4 201A–201D receiving data to shift; the multiplexers 1 to 4 202A–202D choosing each data from the shift registers 201A–201D; tab coefficient generating section 203 storing the filter tab coefficient; the multipliers 1 to 4 204A–204D multiplying chosen data from the multiplexers 1 to 4 202A–202D by the tab coefficient of tab coefficient generating section 203; the data storage units 1 to 8 205A1–205D1, 205A2–205D2 respectively storing the multiplication result output from the multipliers 1 to 4 204A–204D; the multiplexers 5 to 8 206A-206B outputting the chosen data among the storing section 205A1–205D1, 205A2–205D2, the adders 1 and 2 207A, 207B adding the data output from the multiplexers 5 to 8 206A–206D; the adder 3 207C adding again the add result data output from the adders 1 and 2 207A, 207B; the data storage units 9 to 12 208A–208D respectively storing the output data from the adder 3 207C; the adders 4 and 5 209A, 209B adding the output data from the data storage units 9 to 12 208A–208D; the adder 6 209C adding again the add result data output from the adders 4 and 5 209A, 209B; and the round-offer 210 rounding off the data output from the adder 6 209C if the bit values of bits less than wanted bit number are 1.

Figure 4:
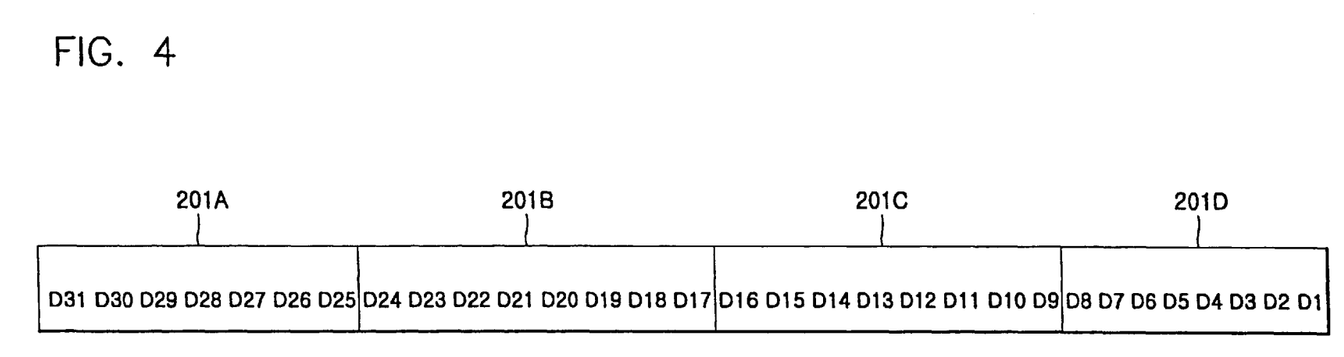
FIG. 4 is the data status stored in the shift register applied to the present invention.
Figure 5:
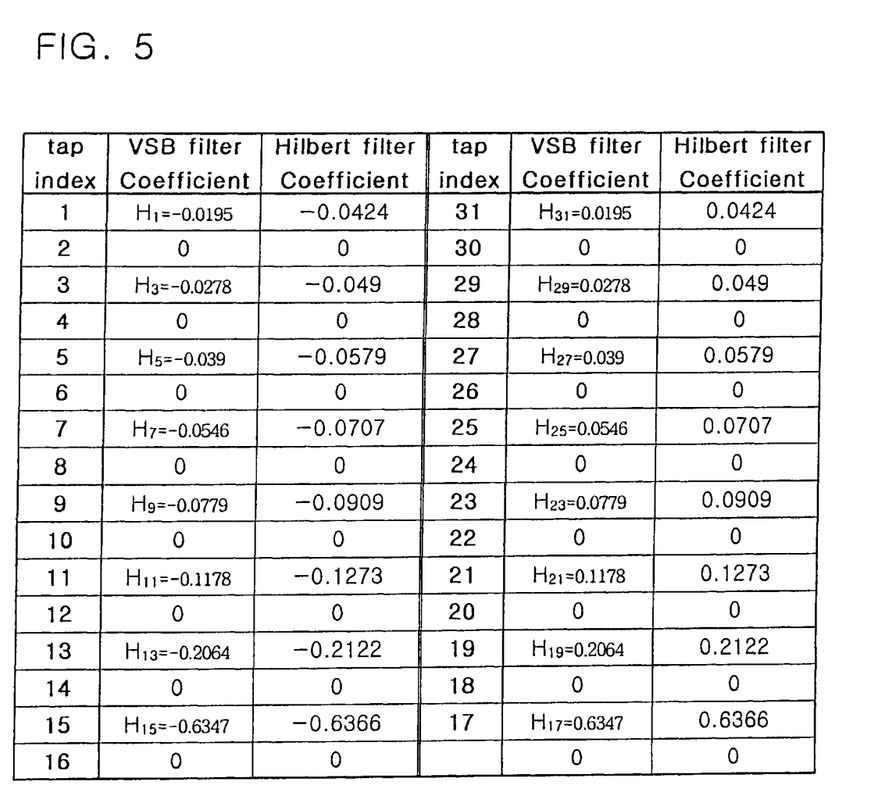
FIG. 5 is the embodiment of the tab coefficient applied to the present invention.

FIG. 4 shows the data status stored in the shift register applied for the present invention; FIG. 5 shows an embodiment of tab coefficient applied for the present invention.

As shown in FIG. 5, 15 tabs coefficient is 0 including the central tab among 31 tabs. Therefore, 15 tabs just delay the processing time, but not are used for calculating the output value. The present output value of the filter is determined by the value in the rest 16 tabs. From the central tab, the left and the right tabs have opposite sign with the same absolute value each other.

Figure 6:
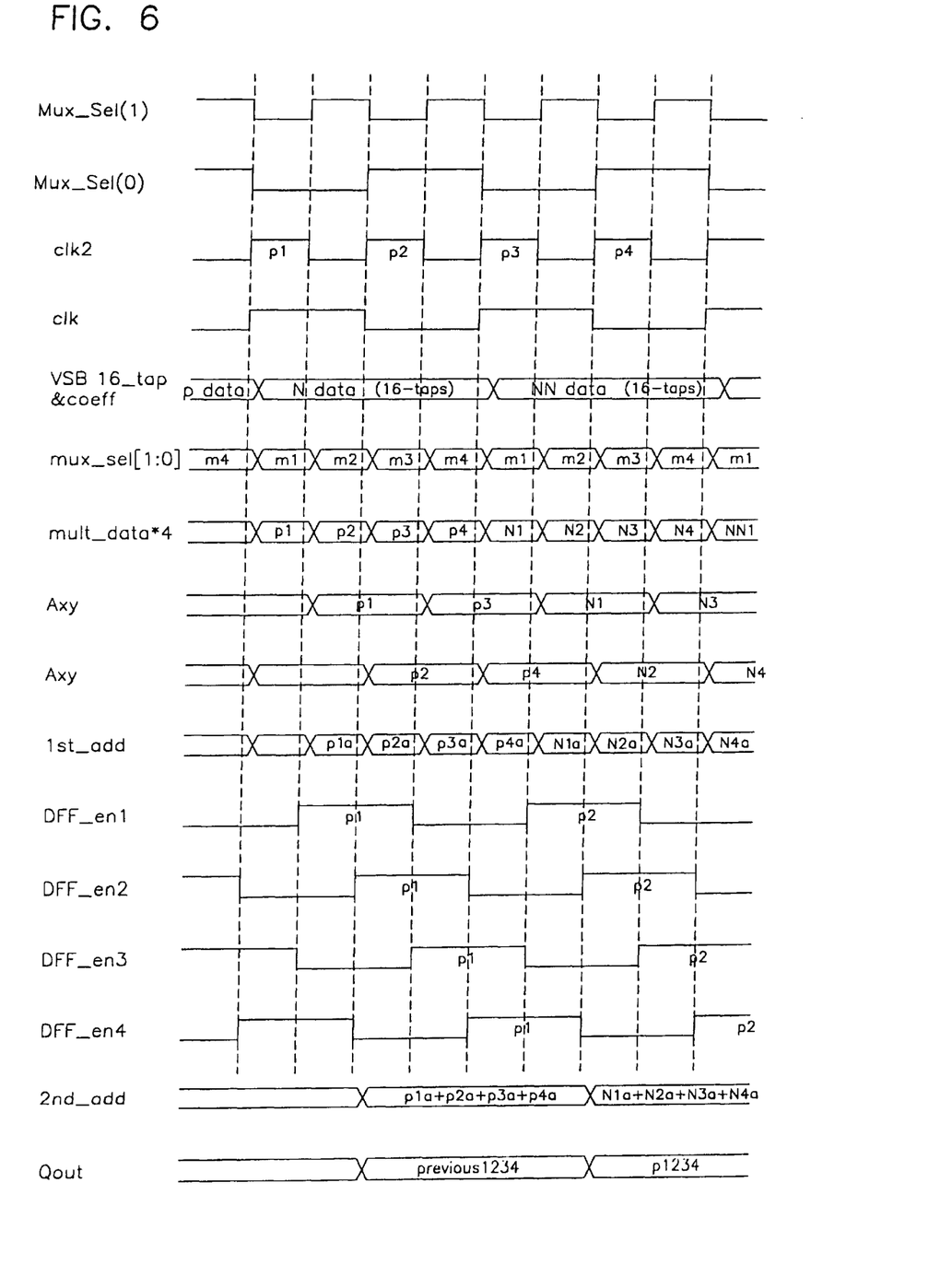
FIG. 6 is the timing diagram of the FIR (Finite Impulse Response) filter with non-symmetric frequency response characteristics according to the present invention.

FIG. 6 shows the timing diagram of filter arithmetic section. The data stored in the shift registers 201A–201D is applied to the multipliers 204A–204D being selected by the multiplexers 202A–202D according to the input control signal mux_se10, mux_se11 value for the select signal. So to speak, D25, D27, D29, D31 are selected respectively from the shift register 1 201A; D17, D19, D21, D23, from the shift register 2 201B; D9, D11, D13, D15, from the shift register 3 201C; D1, D3, D5, D7, from the shift register 4 201D.

In the case of mux_se10=0, mux_se11=0, D1, D9, D17, D25 are selected by the multiplexers 202A–202D. At the same time, the coefficient generating section 203 is applied to the multipliers 204A–204D by input control signal mux_se10, mux_se11 selecting the tab coefficients H1, H9, H17, H25 from each multiplexer 71–74.

Figure 7:
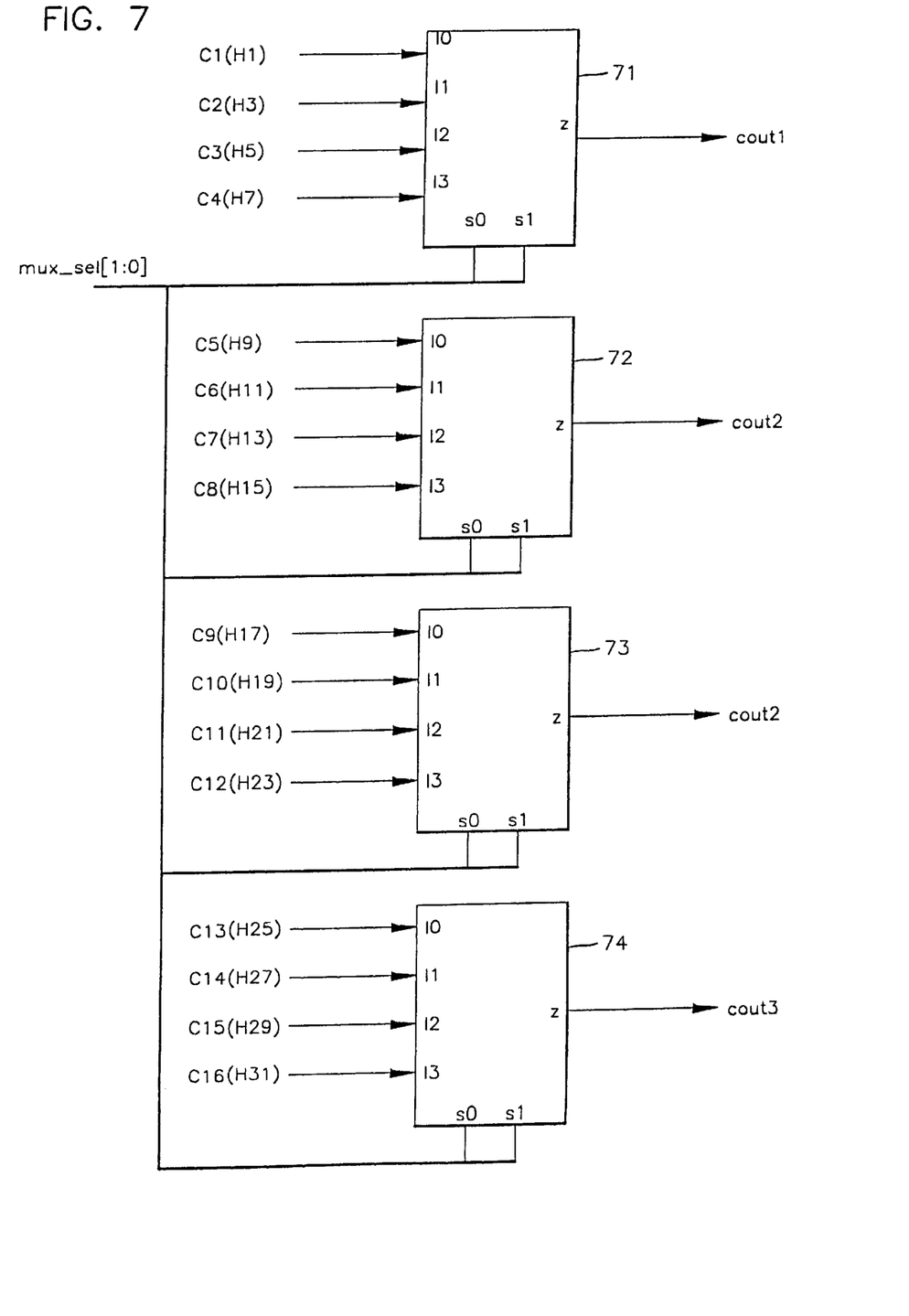
FIG. 7 is the block diagram of tab coefficient generating section in the FIR (Finite Impulse Response) filter with non-symmetric frequency response characteristics according to the present invention.

FIG. 7 shows the block diagram of the tab coefficient.

Four tab coefficients are applied to the input terminal of four multiplexers 71–74. As shown in FIG. 5, the even tab coefficient is 0, and it just delay the processing time. Therefore, the tab coefficient applied to the input terminal of each multiplexer 71–74 in FIG. 7 is to attach index the odd tab coefficient respectively except the case of the value to be 0. The input control signal mux_se10, mux_se11 is applied to each multiplexer 71–74; one tab coefficient is selected to be output among those four tab coefficients according to this value.

Those selected data D1, D9, D17, D25 and the tab coefficients H1, H9, H17, H25 are multiplied through the multipliers 204A–204D. The multiplication result H1D1, H9D9, H17D17, H25D25 are to be stored in the data storage units 1, 3, 5, 7 205A1, 205B1, 205C1, 205D1 at the falling edge of the pulse 1 P1 of the clock 2 clk2.

Continuously, D3, D11, D19, D27 are selected by the multiplexers 202A–202D in the case of mux_se10=0 and mux_se11=1 (in the period of m2 of FIG. 6). Simultaneously, the tab coefficient generating section 203 is to be applied to the multiplexers 71–74 by the input control signal mux_se10, mux_se11 selecting the tab coefficients H3, H11, H19, H27.

Those selected data D3, D11, D19, D27 and the tab coefficients H3, H11, H19, H27 are multiplied through the multipliers 204A–204D. The multiplication result H3D3, H11D11, H19D19, H27D27 are to be stored in the data storing units 2, 4, 6, 8 205A2, 205B2, 205C2, 205D2 at the rising edge of the pulse 2 P2 of the clock 2 clk2.

D5, D13, D21, D29 are selected by the multiplexers 202A–202D in the case of mux_se10=1 and mux_se11=0 (in the period of m3 of FIG. 6). Simultaneously, the tab coefficient generating section 203 is to be applied to the multiplexers 71–74 by the input control signal mux_se10, mux_se11 selecting the tab coefficients H5, H13, H21, H29. Those selected data D5, D13, D21, D29 and the tab coefficients H5, H13, H21, H29 are multiplied through the multipliers 204A–204D. The multiplication result H5D5, H13D13, H21D21, H29D29 is to be stored in the data storage units 1, 3, 5, 7 205A1, 205B1, 205C1, 205D1 at the falling edge of the pulse 2 P2 of the clock 2 clk2.

The multiplication result H1D1, H9D9, H17D17, H25D25 stored in the data storage units 1, 3, 5, 7 205A1, 205B1, 205C1, 205D1 at the falling edge of the pulse 1 P1 of the clock 2 clk2 is to be output at the falling edge of the pulse 2 P2 of the clock 2 clk2. The output multiplication results H1D1, H9D9, H17D17, H25D25 are selected by the multiplexers 5 to 8 206A–206B to be added from the adder 1 207A and the adder 2 207B; the addition result (H1D1+H9D9) of the adder 1 207A and that (H17D17+H25D25) of the adder 2 207B are added again from the adder 3 207C to be output H1D1+H9D9+H17D17+H25D25. This addition result H1D1+H9D9+H17D17+H25D25 is stored in the data storage unit 9 208A at the rising edge of the pulse 1 P1 unit the time-division-control signal dff_en2.

D7, D15, D23, D31 are selected by the multiplexers 202A–202D in the case of mux_se10=1 and mux_se11=1 (in the period of m4 of FIG. 6). Simultaneously, the tab coefficient generating section 203 is to be applied to the multiplexers 71–74 by the input control signal mux_se10, mux_se11 selecting the tab coefficients H7, H15, H23, H31. Those selected data D7, D15, D23, D31 and the tab coefficients H7, H15, H23, H31 are multiplied through the multipliers 204A–204D. The multiplication results H7D7, H15D15, H23D23, H31D31 are to be stored in the data storage units 2, 4, 6, 8 205A2, 205B2, 205C2, 205D2 at the rising edge of the pulse 3 P3 of the clock 2 clk2.

The multiplication results H3D3, H11D11, H19D19, H27D27 stored in the data storage units 2, 4, 6, 8 205A2, 205B2, 205C2, 205D2 at the falling edge of the pulse 2 P2 of the clock 2 clk2 are to be output at the falling edge of the pulse 3 P3 of the clock 2 clk2. The output multiplication results H3D3, H11D11, H19D19, H27D27 are selected by the multiplexers 5 to 8 206A–206B to be added from the adder 1 207A and the adder 2 207B; the addition result (H3D3+H11D11) of the adder 1 207A and that (H19D19+H27D27) of the adder 2 207B are added again from the adder 3 207C to be output H3D3+H11D11+H17D17+H25D25. This addition result H3D3+H11D11+H17D17+H25D25 is stored in the data storage unit 10 208B at the rising edge of the pulse 1 P1 of the time-division-control signal dff_en3.

In the case of mux_se10=1 and mux_se11=0 (in the period of m1, clk2=P3, of FIG. 6), the multiplication result H1D1+H9D9+H17D17+H25D25 is stored in the data storage units 1, 3, 5, 7 205A1, 205B1, 205C1, 205D1 at the falling edge of the pulse 3 P3 of the clock 2 clk2 as the process (clk2=P1, m1 period of FIG. 6) is repeated.

The multiplication results H5D5, H13D13, H21D21, H29D29 stored in the data storing unit 1, 3, 5, 7 205A1, 205B1, 205C1, 205D1 at the falling edge of the pulse 2 P2 of the clock 2 clk2 are to be output at the falling edge of the pulse 3 P3 of the clock 2 clk2. The output multiplication result H5D5, H13D13, H21D21, H29D29 is selected by the multiplexers 5 to 8 206A–206D to be added from the adder 1 207A and the adder 2 207B; the addition result (H5D5+H13D13) of the adder 1 207A and that (H21D21+H29D29) of the adder 2 207B are added again from the adder 3 207C to be output H5D5+H13D13+H21D21+H29D29. This addition result H5D5+H13D13+H21D21+H29D29 is stored in the data storage unit 11 208C at the rising edge of the pulse 1 P1 of the time-division-control signal dff_en4.

In the case of mux_se10=0 and mux_se11=1 (between clk2=P3 and P4, m2 period of FIG. 6), the multiplication results H3D3, H11D11, H19D19, H27D27 are stored in the data storage units 2, 4, 6, 8 205A2, 205B2, 205C2, 205D2 at the rising edge of the pulse 4 P4 of the clock 2 clk2 as the process (between clk2=P1 and P2, m2 period of FIG. 6) is repeated.

The multiplication results H7D7, H15D15, H23D23, H31D31 stored in the data storage units 2, 4, 6, 8 205A2, 205B2, 205C2, 205D2 at the rising edge of the pulse 3 P3 of the clock 2 clk2 are to be output at the rising edge of the pulse 4 P4 of the clock 2 clk2. The output multiplication results H7D7, H15D15, H23D23, H31D31 are selected by the multiplexers 5 to 8 206A–206D to be added from the adder 1 207A and the adder 2 207B; the addition result (H7D7+H15D15) of the adder 1 207A and that (H23D23+H31D31) of the adder 2 207B are added again from the adder 3 207C to be output H7D7+H15D15+H23D23+H31D31. This addition result H7D7+H15D15+H23D23+H31D31 is stored in the data storing section 12 208D at the rising edge of the pulse 2 P2 of the time-division control signal dff_en1.

Adding all tabs in this way in four steps and storing it in each D flip-flop 208A–208D produce the 90°shifted signal Qout by adding finally all tabs in the adding section 209.

The data stored in the storing section 9 to 12 208A–208D is to be added through the adder 4 209A and the adder 5 209B at the rising edge of the pulse 4 P4 of the clock 2 clk2; the adding result (H1D1+H9D9+H17D17+H25D25+H3D3+H11D11+H17D17+H25D25) of the adder 4 209A and that (H5D5+H13D13+H21D21+H29D29+H7D7+H15D15+H23D23+H31D31) of the adder 5 209B are added again in the adder 6 209C to be output H1D1+H3D3+H5D5+H7D7+H9D9+H11D11+H13D13+H15D15 H17D17+H19D19+H21D21+H23D23+H25D25+H27D27+H29D29+H31D31 to the round-offer 210.

As explained in the above, it can be reduced in the circuit elements and in the chip size accumulated them by using the one fourth of the multiplier numbers of the prior FIR (Finite Impulse Response) filter.

What is claimed is:

1. A FIR (Finite Impulse Response) filter outputting an input signal shifted by 90°, comprising:

a control signal generating means for generating a plurality of control signals delaying one fourth of a cycle each other due to receiving a signal from a second clock with double the reference frequency of a reference clock and for generating select signals having a phase opposite to both of the clocks;

a shift register section including a plurality of shift registers for receiving data to shift;

first multiplexer means including a first plurality of multiplexers for selecting each data from the shift register section;

tab coefficient generating means for generating a tab coefficient of the filter, multiplying means including a plurality of multipliers for multiplying the selected data from the first multiplexer means by a coefficient of the tab coefficient generating means for providing a multiplication result output;

a first data storage means including a first plurality of data storage units respectively for storing the multiplication result output from the multiplying means;

second multiplexer means for outputting the data selected from one out of the first plurality of data storage units in the first data storage means;

first adding means for adding the output data from the second multiplexer means;

second data storage means including a second plurality of data storage units for storing the outputs data from the first adding means; and second adding means for adding the output data from the second data storage means.

2. The FIR (Finite Impulse Response) filter as claimed in claim 1, wherein the shift register section comprises four N-bit 8 tab shift registers.

3. (Amended) The FIR (Finite Impulse Response) filter as claimed in claim 1, wherein the first multiplexer means comprises a plurality of multiplexers for selecting each data from the shift register section according to the select signal of the control signal generating means.

4. The FIR (Finite Impulse Response) filter as claimed in claim 1, wherein the tab coefficient generating means comprises four multiplexers for selecting a tab coefficient equivalent to each data selected by a respective multiplexer of the first multiplexer means according to the select signal of the control signal generating means.

5. The FIR (Finite Impulse Response) filter as claimed in claim 4, wherein the multiplexer of the tab coefficient generating means selects a tab coefficient except for 0.

6. The FIR (Finite Impulse Response) filter as claimed in claim 1, wherein the multiplying means includes four multipliers.

7. The FIR (Finite Impulse Response) filter as claimed in claim 1, wherein a multiplier of the multiplying means multiplies the tab coefficients equivalent to data selected by a respective multiplexer of the first multiplexer means receiving input from the tab coefficient generating means.

8. The FIR (Finite Impulse Response) filter as claimed in claim 1, wherein the first data storing means comprises data storage units multiplied two times by a multiplier number of the multiplying means.

9. The FIR (Finite Impulse Response) filter as claimed in claim 7, wherein the first data storing means comprises the first data storage unit storing the multiplication result output from a respective multiplier of the multiplying means and the second data storage unit storing a next multiplication result.

10. The FIR (Finite Impulse Response) filter as claimed in claim 7, wherein the first data storage unit stores a first multiplication result output from a respective multiplier and the second data storage unit stores a next multiplication result.

11. The FIR (Finite Impulse Response) filter as claimed in claim 1, wherein the first data storing means comprises the first data storage unit storing a multiplication result output from a respective multiplier of the multiplying means and the second data storage unit storing a next multiplication result.

12. The FIR (Finite Impulse Response) filter as claimed in claim 1, wherein the first adding means adds all data output from the second multiplexer means.

13. The FIR (Finite Impulse Response) filter as claimed in claim 1, wherein the second data storing means comprises four data storage units storing data output from the first adding means according to control signals outputted from the control signal generating means and delayed by one fourth of cycle one another.

14. The FIR (Finite Impulse Response) filter as claimed in claim 1, wherein the second adding means adds all data from the data storage units of the second data storing means and outputs them.

15. The FIR (Finite Impulse Response) filter as claimed in claim 1, wherein the second multiplexer means comprises four multiplexers, and the multiplexer selects data pertinent to an odd tab in an N-bit 8 tab shift register.

16. The FIR (Finite Impulse Response) filter as claimed in claim 1, wherein the first multiplexer means comprises four multiplexers, and the multiplexer selects data pertinent to an odd tab in an N-bit 8 tab shift register.

17. The FIR (Finite Impulse Response) filter as claimed in claim 1, wherein the first data storage unit stores a multiplication result output from a respective multiplier and the second data storage unit stores a next multiplication unit.

18. The FIR (Finite Impulse Response) filter as claimed in claim 1, wherein the second multiplexer means comprises a plurality of 2×1 multiplexers for selecting either stored data in the first data storage unit or those in the second data storage unit of the first storing means according to a select signal value that converts the reference clock.

* * * * *